(12) United States Patent
Derraa et al.

(10) Patent No.: US 6,730,355 B2
(45) Date of Patent: May 4, 2004

(54) CHEMICAL VAPOR DEPOSITION METHOD OF FORMING A MATERIAL OVER AT LEAST TWO SUBSTRATES

(75) Inventors: Ammar Derraa, Boise, ID (US); Cem Basceri, Boise, ID (US); Irina Vasilyeva, Boise, ID (US); Philip H. Campbell, Meridian, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 49 days.

(21) Appl. No.: 10/094,579

(22) Filed: Mar. 6, 2002

(65) Prior Publication Data

US 2003/0170390 A1 Sep. 11, 2003

(51) Int. Cl.$^7$ .............................................. C23C 16/42
(52) U.S. Cl. ..................... 427/255.391; 427/255.393; 427/535
(58) Field of Search .................. 427/255.391, 255.393, 427/535

(56) References Cited

U.S. PATENT DOCUMENTS

| | | |
|---|---|---|
| 4,957,777 A | 9/1990 | Ilderem et al. |
| 5,240,739 A | 8/1993 | Doan et al. |
| 5,252,518 A | 10/1993 | Sandhu et al. |
| 5,278,100 A | 1/1994 | Doan et al. |
| 5,344,792 A | 9/1994 | Sandhu et al. |
| 5,376,405 A | 12/1994 | Doan et al. |
| 5,976,976 A | 11/1999 | Doan et al. |
| 6,019,839 A * | 2/2000 | Achutharaman et al. ...... 117/88 |
| 6,086,442 A | 7/2000 | Sandhu et al. |
| 6,245,674 B1 | 6/2001 | Sandhu |
| 6,255,216 B1 * | 7/2001 | Doan et al. .................. 438/683 |
| 6,444,556 B2 * | 9/2002 | Sharan et al. ................ 438/597 |
| 6,472,756 B2 * | 10/2002 | Doan et al. .................. 257/770 |
| 6,554,910 B1 * | 4/2003 | Sandhu et al. ................. 134/26 |

* cited by examiner

Primary Examiner—Bret Chen
(74) Attorney, Agent, or Firm—Wells St. John P.S.

(57) ABSTRACT

A first substrate is provided within a chemical vapor deposition chamber. A reactive gas mixture comprising $TiCl_4$ and a silane is provided within the chamber effective to first chemically vapor deposit a titanium silicide comprising layer on the first substrate. After the first deposit, the first substrate is removed from the chamber. After the first deposit, a first cleaning is conducted within the chamber with a chlorine comprising gas. After the first cleaning, a second cleaning is conducted within the chamber with a hydrogen comprising gas. After the second cleaning and after the removing, a titanium silicide comprising layer is chemically vapor deposited over a second substrate within the chamber using a reactive gas mixture comprising $TiCl_4$ and a silane. Other implementations are disclosed.

60 Claims, No Drawings

CHEMICAL VAPOR DEPOSITION METHOD OF FORMING A MATERIAL OVER AT LEAST TWO SUBSTRATES

TECHNICAL FIELD

This invention relates to chemical vapor deposition methods of forming titanium silicide comprising and other layers.

BACKGROUND OF THE INVENTION

Conductively doped silicon regions are conventionally utilized as source/drain regions of field effect transistors and as other node locations in integrated circuitry. In fabricating integrated circuitry having such regions, insulative layers are typically fabricated over the regions and contact openings are formed therethrough to the regions. Conductive material is ultimately received within the openings and makes electrical connection with the conductively doped source/drain or other regions. Exemplary conductive materials include conductively doped polysilicon and other semiconductive materials, metals, and metal compounds.

Refractory metal silicides, such as titanium silicide, have been utilized as part of the conductive material, typically as an interface region between the conductively doped silicon region and other overlying conductive material. One prior art method of forming the titanium silicide is to deposit elemental titanium and thereafter heat the substrate to cause a reaction of the deposited titanium with underlying silicon to form the silicide. Alternately, deposition conditions can be selected such that the depositing titanium reacts with the silicon from the substrate during deposition to form the silicide. In either instance, silicon is consumed from the underlying substrate diffusion junction region in forming the silicide.

In certain applications, particularly in light of the ever-increasing density of circuitry being fabricated, it is highly undesirable for a significant quantity of the underlying silicon of the junction to be consumed. Accordingly, methods have been developed which prevent, or at least reduce, underlying silicon consumption by providing a silicon source other than or in addition to the silicon of the substrate for forming the silicide. One prior art method is to plasma enhance, chemically vapor deposit the silicide by combining a silane gas and $TiCl_4$ under suitable reaction conditions to form titanium silicide which deposits over the junction region with minimal if any consumption of substrate silicon. Unfortunately, the wafer surface has been found on occasion to become contaminated with particles in processes utilizing $TiCl_4$ and a silane as compared to primarily forming the silicide by reacting titanium with silicon of the substrate.

It was surmised that the particles which were undesirably forming on the wafers might be occurring during either or both of the actual titanium silicide deposition or after the deposition when the wafers were being moved into and out of the reactor chamber. While unclear, it was theorized that the particle formation might be occurring from silane and/or chlorine constituents adhering to the chamber sidewalls perhaps as a result of the deposition, or that chlorine was somehow undesirably being added to the chamber walls during a chamber cleaning which uses chlorine intermediate each wafer deposition.

For example, one exemplary prior art processing intending to reduce particle count employs a $Cl_2$ clean between titanium silicide depositions on separate wafers. For example, after a silicide deposition on one wafer within a reactor chamber, the wafer is removed from the chamber. Then, an argon flow of 500 sccm as a purge gas is flowed through the chamber. This is followed by a $Cl_2$ flow of 2,000 sccm for two seconds as a stabilizing step, with the $Cl_2$ flow then being continued at 2,000 sccm for an additional 15 seconds. The intended effect of the $Cl_2$ clean is to remove titanium material which might undesirably adhere to the internal surfaces of the chamber during the titanium silicide deposition. Upon completion of the $Cl_2$ cleaning step, an 8,000 sccm argon purge feeding is conducted to remove the chlorine. This is followed by a flow of Ar at 8,000 sccm in combination with 1,000 sccm of He. He is lighter than Ar, and can facilitate chamber purging and cleaning, and also facilitates temperature control within the chamber. Subsequently, another wafer is provided within the chamber, and titanium silicide deposition is conducted.

The above-described cleaning process is typically conducted between each single wafer deposition, and typically in the absence of plasma. Yet every 10 to 20 wafer depositions, the chamber is also typically subjected to a plasma clean with $Cl_2$ to better clean/remove titanium from the chamber walls. Further, every 5,000 or so wafer depositions, the whole system is subjected to an atmospheric/room ambient pressure wet clean and scrub (i.e., using $NH_4OH$, $H_2O_2$ and isopropyl alcohol in various steps) whereby the whole system is cleaned out. The other above-described cleanings are typically conducted with the reactor chamber essentially at the deposition pressure and temperature conditions.

The invention was principally motivated towards overcoming the above-described surface defect issues, but is in no way so limited. The invention is only limited by the accompanying claims as literally worded without limiting or interpretative reference to the specification, and in accordance with the doctrine of equivalents.

SUMMARY

The invention includes chemical vapor deposition methods of forming titanium silicide comprising and other layers over at least two substrates. In one implementation, a first substrate is provided within a chemical vapor deposition chamber. A reactive gas mixture comprising $TiCl_4$ and a silane is provided within the chamber effective to first chemically vapor deposit a titanium silicide comprising layer on the first substrate. After the first deposit, the first substrate is removed from the chamber. After the first deposit, a first cleaning is conducted within the chamber with a chlorine comprising gas. After the first cleaning, a second cleaning is conducted within the chamber with a hydrogen comprising gas. After the second cleaning and after the removing, a titanium silicide comprising layer is chemically vapor deposited over a second substrate within the chamber using a reactive gas mixture comprising $TiCl_4$ and a silane.

In one implementation, a first substrate is provided within a chemical vapor deposition chamber. A reactive gas mixture comprising at least a reactive precursor X and a reactive precursor Y are provided to effectively react to first chemically vapor deposit a material C on the first substrate and which form a reaction by-product contaminant D on internal surfaces of the chamber. At least one of X and Y is reactive with D to form particles on subsequent substrates when subsequently depositing material C thereon using at least X and Y After the first deposit, the first substrate is removed from the chamber. After the first deposit, the chamber is cleaned with a gas A effective to react with D. After the cleaning and after the removing, material C is chemical vapor deposited on a second substrate within the chamber using a reactive gas mixture comprising at least reactive precursor X and reactive precursor Y.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses chemical vapor deposition methods of forming titanium silicide comprising layers over at least two substrates. The description below and concluding claims include references to first, second, third, etc. substrates, deposits, cleanings, etc. Such only indicate sequence with respect to the respective acts or nouns which they qualify, and in no way preclude other processing including, for example, a deposit, cleaning, etc. occurring intermediate the stated processings, nor do they preclude processings prior to the first stated processing nor after the last stated processing.

In accordance with an aspect of the invention, a first substrate is positioned within a chemical vapor deposition chamber. By way of example only, the first substrate typically will comprise a semiconductor wafer or other substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The chemical vapor deposition chamber may be any suitable reactor, whether existing or yet-to-be developed, including, by way of example only, a single-wafer plasma enhanced chemical vapor deposition reactor with any of direct, remote or other plasma activation capability.

A reactive gas mixture comprising $TiCl_4$ and a silane is provided within the chamber effective to first chemically vapor deposit a titanium silicide comprising layer on the first substrate. Any suitable reactive gas mixture, whether existing or yet-to-be developed, including $TiCl_4$ and a silane is contemplated. An exemplary silane is $SiH_4$, with silanes including more than one silicon atom, and organic silanes, also of course being contemplated. By way of example only, one preferred process of forming a titanium silicide comprising layer includes plasma enhanced chemical vapor depositions at an exemplary power range of from 200 watts to 600 watts, a substrate temperature range of from 600° C. to 700° C. and a chamber pressure range of from 3 Torr to 6 Torr. Exemplary processing gases include $SiH_4$ at from 0.5 sccm to 10 sccm, $TiCl_4$ at from 50 sccm to 150 sccm, Ar at from 2,000 sccm to 6,000 sccm, He at from 1,000 sccm to 2,000 sccm and $H_2$ at from 200 sccm to 10,000 sccm in a 6.55 liter chamber. Such exemplary processing can be conducted to deposit a titanium silicide comprising layer which consists essentially of titanium silicide. An exemplary existing plasma enhanced chemical vapor deposition system usable in conjunction with the above-described process is the Centura Model #2658, available from Applied Materials of Santa Clara, Calif. The invention was reduced to practice in single wafer processors, although processing is contemplated in the context of multiple wafer processors.

After the first chemical vapor deposit, the first substrate is removed from the chamber. Preferably, the timing of such removal occurs prior to any cleaning processings, for example as described below, although such is not required.

Regardless, after the first chemical vapor deposit, the chamber preferably is cleaned with a hydrogen comprising gas. Exemplary hydrogen comprising gases include any of $H_2$, $NH_3$ and hydrozene (for example, monomethylhydrozene), as well as any mixture of these or other hydrogen containing (as well as non-hydrogen containing) gases. One preferred hydrogen gas comprises a gas mixture including $H_2$ and Ar. Preferably, such a gas mixture comprises more $H_2$ than Ar by volume. Further preferably, such an exemplary gas mixture can consist essentially of $H_2$ and Ar. Plasma or non-plasma conditions, whether direct or remote, can be utilized. In certain aspects of the invention, this hydrogen comprising cleaning as described above is optional, as is inherent from the concluding collection of claims. By way of example only, and in not in any way of limitation to any claim unless expressly stated therein, a desired effect of this hydrogen cleaning is to completely remove or at least reduce any silane residue from the previous deposition that might be adhering to the internal surfaces of the chamber.

An exemplary preferred processing for conducting the above-described first cleaning preferably includes an exemplary pressure range of from 3 Torr to 6 Torr at a substrate temperature from 600° C. to 680° C. Preferably, an argon pre-purge is conducted for from about 2 seconds to 5 seconds at from 200 sccm to 2,000 sccm, with 500 sccm being a specific example. This is followed by the preferred hydrogen comprising gas treatment for a preferred exemplary time period of from 5 seconds to 20 seconds. Exemplary preferred flow rates when utilizing $H_2$ and Ar are from 500 sccm to 12,000 sccm for $H_2$, and from 3,000 sccm to 15,000 sccm for Ar in a 6.55 liter chamber. A specific preferred example is Ar at 8,000 sccm and $H_2$ at 12,000 sccm for 5 seconds.

After the above-described preferred first cleaning, a cleaning of the chamber is conducted with a chlorine comprising gas which, for convenience at least in the description section of this document, is referred to as a second cleaning with a chlorine comprising gas. Preferably, the second cleaning of the chamber with the chlorine comprising gas also comprises Ar, and even more preferably, more Ar than chlorine by volume. One preferred example chlorine comprising gas is $Cl_2$. By way of example only, an exemplary process for conducting a cleaning with a chlorine comprising gas in a 6.55 liter chamber includes starting with a flow of 1,000 sccm $Cl_2$ and a flow of 8,000 sccm Ar for from about 0.5 second to 3 seconds (2 seconds being a specific example) to establish stabilization, followed by the continuing of such flow for an additional 5 to 20 seconds (7 seconds being a specific example). Further by way of example only, an exemplary flow range for chlorine in a 6.55 liter chamber is from 400 sccm to 2,000 sccm, with an exemplary flow range for Ar being from 3,000 sccm to 15,000 sccm. A preferred chamber pressure is from 2 Torr to 10 Torr. By way of example only, and in no way by way of limitation unless expressly provided in a claim, a desired effect of the chlorine gas cleaning is to completely remove or at least reduce any titanium presence from internal chamber surfaces.

After cleaning the chamber with a chlorine comprising gas, the chamber is cleaned with a hydrogen comprising gas. Such hydrogen comprising gas and cleaning might be the same as the first stated chamber cleaning with a hydrogen comprising gas, or be different. By way of example only, and in no way by way of limitation unless expressly provided in a claim, an intended effect of this cleaning with a hydrogen comprising gas is to completely remove or at least reduce any chlorine presence which might have adhered to the chamber sidewalls during the above-described titanium cleaning with a chlorine comprising gas. In one preferred embodiment, and at the conclusion of the immediately above-described cleaning with the hydrogen gas subsequent to the cleaning with the chlorine comprising gas, chamber cleaning and purging is continued with a gas mixture comprising, and more preferably consisting essentially of, $H_2$, Ar and He. Preferably, such gas mixture comprises more $H_2$ than either Ar or He by volume, and further preferably comprises more Ar than He by volume. By way of example only, one exemplary subsequent cleaning/purging includes an Ar flow of 8,000 sccm, a $H_2$ flow of 12,000 sccm, and a He flow of 1,000 sccm. Further, the $H_2$ flow could be eliminated with Ar and He flow being continued or, of course, the last stated purging and cleaning being optional and could be eliminated altogether. By way of example only, an exemplary intent or purpose for this processing is to one or both continue the cleaning with a hydrogen comprising gas and to better purge the chamber of all contaminants by using an additional gas, He, which is lighter than Ar. Preferred processing ranges for each of the above cleanings is from 5 seconds to 20 seconds.

As referred to above, the first substrate has preferably been removed from the chamber prior to any of the above-stated cleanings. Alternately but less preferred, such first substrate could remain within the chamber during some or all of the above-stated cleanings or other processings. Regardless, in accordance with the invention, the first substrate is ultimately removed from the chamber and some second substrate is provided within the chamber. A titanium silicide comprising layer is chemical vapor deposited over the second substrate within the chamber using a reactive gas mixture comprising $TiCl_4$ and a silane. The reactive gas mixture and deposition conditions may be the same as described above with respect to deposition on the first stated substrate, or be different.

In one preferred embodiment, temperature and pressure within the chamber are maintained substantially constant throughout all of the above-described processing, including when substrates are moved into and out of the chamber. Any of the above processings can be conducted with or without plasma.

Processing in accordance with the above was found to significantly reduce particle/defect count on the surface of the substrate at the conclusion of the titanium silicide depositions.

In addition to utilizing the above-described hydrogen comprising gas cleaning after a chlorine comprising gas cleaning, chlorine comprising cleaning might be modified to minimize chlorine incorporation within the chamber. For example, and by way of example only, the chlorine comprising gas cleaning might be conducted with a shorter time than in the old processing. For example, one prior chlorine comprising gas cleaning was for 15 seconds, with chlorine cleaning in accordance with the invention preferably being conducted at 10 seconds or less. Further, a lower chlorine containing gas flow might be utilized in the optimization of a process in accordance with the invention as compared to the above-described prior art processing. For example, a previous chlorine comprising gas cleaning without any hydrogen cleaning was typically conducted at 2,000 sccm. Such might be more advantageously conducted at or below 1,000 sccm. Existing processing involving a chlorine gas cleaning typically conducts such as a plasma after the processing of 10 to 20 wafers. Typically, such processing in a parallel plate, top powered, plasma enhanced chemical vapor deposition chamber powers the top plate at 200 watts. Such plasma processing might be lowered to a top plate power of 100 watts or below for optimization.

The above-described preferred processing also preferably dilutes the chlorine comprising gas flow with argon, whereas the prior art processing typically used a 100% $Cl_2$. Further, $TiCl_4$ flow during the deposition of titanium silicide comprising layers might be lowered somewhat to further reduce chlorine incorporation, for example from 100 sccm to 70 sccm or lower.

The above described preferred embodiment was with respect to formation of $TiSi_X$ comprising layers. However, the invention is seen to have applicability to formation of other materials and using other gases. For example, the invention is seen to be applicable to forming a material over at least two substrates whereby a first substrate is provided within a chemical vapor deposition chamber. A reactive gas mixture comprising at least a reactive precursor X and a reactive precursor Y (i.e., $SiH_4$ and $TiCl_4$, respectively) are provided to effectively react to first chemically vapor deposit a material C (i.e., $TiSi_2$) on the first substrate and which form a reaction by-product contaminant D (i.e., chlorine) on internal surfaces of the chamber. At least one of X and Y is reactive with D to form particles on subsequent substrates when subsequently depositing material C thereon using at least X and Y After the first deposit, the first substrate is removed from the chamber. After the first deposit, the chamber is cleaned with a gas A (i.e., a hydrogen containing gas) effective to react with D. The cleaning and reaction may remove D or merely neutralize it from forming subsequent particles. After the cleaning and after the removing, material C is chemical vapor deposited on a second substrate within the chamber using a reactive gas mixture comprising at least reactive precursor X and reactive precursor Y.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A chemical vapor deposition method of forming titanium silicide comprising layers over at least two different substrates, comprising:

providing a first substrate within a chemical vapor deposition chamber;

providing a reactive gas mixture comprising $TiCl_4$ and a silane within the chamber effective to first chemically vapor deposit a titanium silicide comprising layer on the first substrate;

after the first deposit, removing the first substrate from the chamber;

after the first deposit, first cleaning the chamber with a chlorine comprising gas;

after the first cleaning, second cleaning the chamber with a hydrogen comprising gas; and after the second cleaning and after the removing, chemical vapor depositing a titanium silicide comprising layer over another second substrate within the chamber using a reactive gas mixture comprising $TiCl_4$ and a silane.

2. The method of claim 1 wherein the removing occurs before the second cleaning.

3. The method of claim 1 wherein the removing occurs before the first cleaning.

4. The method of claim 1 wherein the removing occurs after the first cleaning.

5. The method of claim 1 wherein the removing occurs after the first cleaning and before the second cleaning.

6. The method of claim 1 wherein the hydrogen comprising gas comprises $H_2$.

7. The method of claim 1 wherein the hydrogen comprising gas comprises $NH_3$.

8. The method of claim 1 wherein the hydrogen comprising gas comprises a hydrozene.

9. The method of claim 8 wherein the hydrogen comprising gas comprises monomethylhydrozene.

10. The method of claim 1 wherein the hydrogen comprising gas comprises a gas mixture comprising $H_2$ and Ar.

11. The method of claim 10 wherein the gas mixture comprises more $H_2$ than Ar by volume.

12. The method of claim 1 wherein the hydrogen comprising gas consists essentially of a gas mixture of $H_2$ and Ar.

13. The method of claim 12 wherein the gas mixture comprises more $H_2$ than Ar by volume.

14. The method of claim 1 wherein the hydrogen comprising gas consists essentially of a gas mixture of $H_2$ and Ar; and further comprising after the second cleaning, third cleaning the chamber with a gas mixture consisting essentially of $H_2$, Ar and He.

15. The method of claim 14 wherein the gas mixture during the third cleaning comprises more $H_2$ than either Ar or He by volume.

16. The method of claim 14 wherein the gas mixture during the third cleaning comprises more Ar than He by volume.

17. The method of claim 1 wherein the second cleaning comprises plasma within the chamber.

18. The method of claim 1 wherein the second cleaning comprises generating a plasma remote from the chamber with the hydrogen comprising gas.

19. The method of claim 1 comprising maintaining temperature and pressure within the chamber substantially constant throughout the first deposit, first cleaning, second cleaning and chemical vapor depositing.

20. The method of claim 1 wherein the first cleaning comprises Ar.

21. The method of claim 20 wherein the first cleaning comprises more Ar than chlorine by volume.

22. The method of claim 1 comprising cleaning the chamber with a gas mixture comprising a hydrogen comprising gas and Ar prior to the first cleaning.

23. The method of claim 1 wherein the chlorine comprising gas comprises a mixture including Ar.

24. The method of claim 23 wherein the mixture comprises more Ar than chlorine by volume.

25. The method of claim 1 wherein the chlorine comprising gas consists essentially of a mixture of $Cl_2$ and Ar.

26. The method of claim 25 wherein the mixture comprises more Ar than chlorine by volume.

27. A chemical vapor deposition method of forming titanium silicide comprising layers over at least two different substrates, comprising:

providing a first substrate within a chemical vapor deposition chamber;

providing a reactive gas mixture comprising $TiCl_4$ and a silane within the chamber effective to first chemically vapor deposit a titanium silicide comprising layer on the first substrate;

after the first deposit, removing the first substrate from the chamber;

after the first deposit, first cleaning the chamber with a hydrogen comprising gas;

after the first cleaning, second cleaning the chamber with a chlorine comprising gas;

after the second cleaning, third cleaning the chamber with a hydrogen comprising gas; and after the second cleaning and after the removing, chemical vapor depositing a titanium silicide comprising layer over another second substrate within the chamber using a reactive gas mixture comprising $TiCl_4$ and a silane.

28. The method of claim 27 wherein the hydrogen comprising gas of the first cleaning and of the third cleaning are of the same composition.

29. The method of claim 27 wherein the removing occurs before the first cleaning.

30. The method of claim 27 wherein the second cleaning comprises Ar.

31. The method of claim 30 wherein the second cleaning comprises more Ar than chlorine by volume.

32. The method of claim 27 wherein at least one of the hydrogen comprising gases comprises $H_2$.

33. The method of claim 27 wherein at least one of the hydrogen comprising gases comprises $NH_3$.

34. The method of claim 27 wherein at least one of the hydrogen comprising gases comprises a hydrozene.

35. The method of claim 34 wherein at least one of the hydrogen comprising gases comprises monomethylhydrozene.

36. The method of claim 27 wherein at least one of the hydrogen comprising gases comprises a gas mixture comprising $H_2$ and Ar.

37. The method of claim 27 wherein at least one of the hydrogen comprising gases consists essentially of a gas mixture of $H_2$ and Ar.

38. The method of claim 27 wherein at least one of the hydrogen comprising gases consists essentially of a gas mixture of $H_2$ and Ar; and further comprising after the second cleaning, third cleaning the chamber with a gas mixture consisting essentially of $H_2$, Ar and He.

39. The method of claim 38 wherein the gas mixture during the third cleaning comprises more $H_2$ than either Ar or He by volume.

40. The method of claim 38 wherein the gas mixture during the third cleaning comprises more Ar than He by volume.

41. The method of claim 27 wherein the chlorine comprising gas comprises a mixture including Ar.

42. The method of claim 41 wherein the mixture comprises more Ar than chlorine by volume.

43. The method of claim 27 wherein the chlorine comprising gas consists essentially of a mixture of $Cl_2$ and Ar.

44. The method of claim 43 wherein the mixture comprises more Ar than chlorine by volume.

45. A chemical vapor deposition method of forming titanium silicide comprising layers over at least two different substrates, comprising:

providing a first substrate within a chemical vapor deposition chamber;

providing a reactive gas mixture comprising $TiCl_4$ and a silane within the chamber effective to first chemically vapor deposit a titanium silicide comprising layer on the first substrate;

after the first deposit, removing the first substrate from the chamber;

after the removing, first cleaning the chamber with a gas mixture comprising a hydrogen comprising gas and Ar;

after the first cleaning, second cleaning the chamber with a gas mixture comprising a chlorine comprising gas and Ar;

after the second cleaning, third cleaning the chamber with a gas mixture comprising a hydrogen comprising gas and Ar; and after the second cleaning, chemical vapor depositing a titanium silicide comprising layer over another second substrate within the chamber using a reactive gas mixture comprising $TiCl_4$ and a silane.

46. The method of claim 45 wherein the gas mixture during the third cleaning comprises more Ar than He by volume.

47. The method of claim 45 further comprising after the third cleaning, fourth cleaning the chamber with a gas mixture comprising a hydrogen comprising gas, Ar and He.

48. The method of claim 45 wherein the gas mixture during the second cleaning comprises more Ar than chlorine by volume.

49. The method of claim 45 wherein the hydrogen comprising gas of the first cleaning and of the third cleaning are of the same composition.

50. The method of claim 45 wherein at least one of the hydrogen comprising gases comprises $H_2$.

51. The method of claim 45 wherein at least one of the hydrogen comprising gases comprises $NH_3$.

52. The method of claim 45 wherein at least one of the hydrogen comprising gases comprises a hydrozene.

53. The method of claim 52 wherein at least one of the hydrogen comprising gases comprises monomethylhydrozene.

54. A chemical vapor deposition method of forming a material over at least two different substrates, comprising:

providing a first substrate within a chemical vapor deposition chamber;

providing a reactive gas mixture comprising at least a reactive precursor X and a reactive precursor Y which effectively react to first chemically vapor deposit a material C on the first substrate and which form a reaction by-product contaminant D on internal surfaces of the chamber, at least one of X and Y being reactive with D to form particles on subsequent substrates when subsequently depositing material C thereon using at least X and Y;

after the first deposit, removing the first substrate from the chamber;

after the first deposit, cleaning the chamber with a gas A effective to react with D; and after the cleaning and after the removing, chemical vapor depositing material C on another second substrate within the chamber using a reactive gas mixture comprising at least reactive precursor X and reactive precursor Y.

55. The method of claim 54 wherein the removing occurs before the cleaning.

56. The method of claim 54 wherein the removing occurs after the cleaning.

57. The method of claim 54 wherein the cleaning comprises plasma within the chamber.

58. The method of claim 54 wherein the cleaning comprises generating a plasma remote from the chamber with gas A.

59. The method of claim 54 comprising maintaining temperature and pressure within the chamber substantially constant throughout the first deposit, cleaning, and chemical vapor depositing.

60. The method of claim 54 wherein X comprises $SiH_4$, Y comprises $TiCl_4$, C comprises $TiSi_2$, D comprises chlorine, and A is hydrogen containing.

* * * * *

UNITED STATES PATENT AND TRADEMARK OFFICE
CERTIFICATE OF CORRECTION

PATENT NO. : 6,730,355 B2 Page 1 of 1
DATED : May 4, 2004
INVENTOR(S) : Ammar Derraa et al.

It is certified that error appears in the above-identified patent and that said Letters Patent is hereby corrected as shown below:

Column 2,
Line 65, please delete "Y" after "and" and insert -- Y. --.

Column 4,
Line 19, please delete "in" after "and".

Column 6,
Line 29, please delete "Y" after "and" and insert -- Y. --.

Signed and Sealed this

First Day of February, 2005

JON W. DUDAS
*Director of the United States Patent and Trademark Office*